(12) United States Patent
Takeuchi

(10) Patent No.: US 8,876,350 B2
(45) Date of Patent: Nov. 4, 2014

(54) LIGHT SOURCE DEVICE AND DISPLAY DEVICE PROVIDED WITH SAME

(75) Inventor: Hideto Takeuchi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 434 days.

(21) Appl. No.: 13/321,422

(22) PCT Filed: May 20, 2010

(86) PCT No.: PCT/JP2010/058501
§ 371 (c)(1),
(2), (4) Date: Nov. 18, 2011

(87) PCT Pub. No.: WO2010/134565
PCT Pub. Date: Nov. 25, 2010

(65) Prior Publication Data
US 2012/0063150 A1 Mar. 15, 2012

(30) Foreign Application Priority Data

May 20, 2009 (JP) ................................. 2009-122464
May 17, 2010 (JP) ................................. 2010-113407

(51) Int. Cl.
| G09F 13/04 | (2006.01) |
| F21V 7/04 | (2006.01) |
| G09F 9/33 | (2006.01) |
| H05K 3/00 | (2006.01) |
| H01L 33/60 | (2010.01) |
| H01L 25/075 | (2006.01) |
| H05K 1/14 | (2006.01) |
| H01L 33/58 | (2010.01) |

(52) U.S. Cl.
CPC .............. *G09F 9/33* (2013.01); *H05K 3/0061* (2013.01); *H01L 33/60* (2013.01); *H01L 25/0753* (2013.01); *H05K 2201/2054* (2013.01); *H05K 1/142* (2013.01); *H05K 2201/10106* (2013.01); *H01L 33/58* (2013.01)
USPC ............................ 362/609; 362/97.1; 349/67

(58) Field of Classification Search
USPC ....................................... 362/609, 97; 349/67
See application file for complete search history.

(56) References Cited

U.S. PATENT DOCUMENTS

| 2006/0238881 A1 | 10/2006 | Park et al. |
| 2007/0109767 A1 | 5/2007 | Han et al. |
| 2010/0208171 A1 | 8/2010 | Yamazaki et al. |

FOREIGN PATENT DOCUMENTS

| CN | 1851500 A | 10/2006 |
| JP | 47-030134 | 9/1972 |
| JP | 48-021532 | 6/1973 |
| JP | 2007-128887 A | 5/2007 |
| JP | 3918873 B | 5/2007 |
| JP | 2007-227876 A | 9/2007 |
| JP | 2008-041546 A | 2/2008 |
| JP | 2010-192285 A | 9/2010 |

OTHER PUBLICATIONS

International Search Report, PCT/JP2010/058201, Jun. 15, 2010.

*Primary Examiner* — Joseph L Williams
(74) *Attorney, Agent, or Firm* — Birch, Stewart, Kolasch & Birch, LLP

(57) ABSTRACT

A light source device includes a circuit board having a LED mounted on a surface, a lens attached to the surface so as to diffuse light emitted from the LED, a reflecting sheet having a through hole in the inside of which the lens is disposed and reflecting light emitted from the LED at an opposite side of the surface, and a restricting member which is disposed at one of an edge of the through hole in the reflecting sheet and the lens, and restricts a deviation of the reflecting sheet in a direction departing from the surface.

11 Claims, 21 Drawing Sheets

F I G. 3
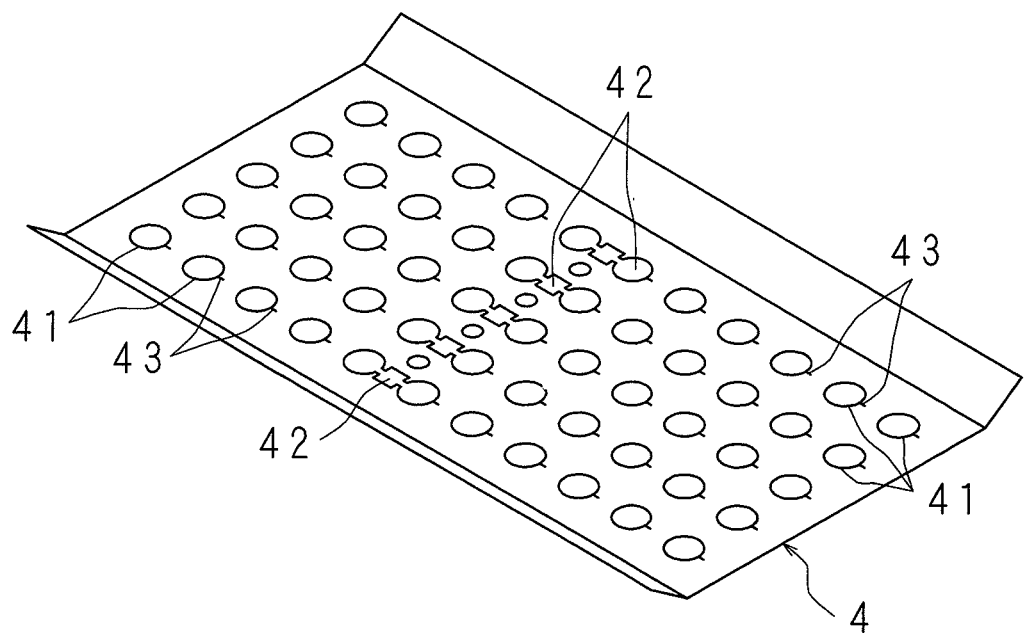
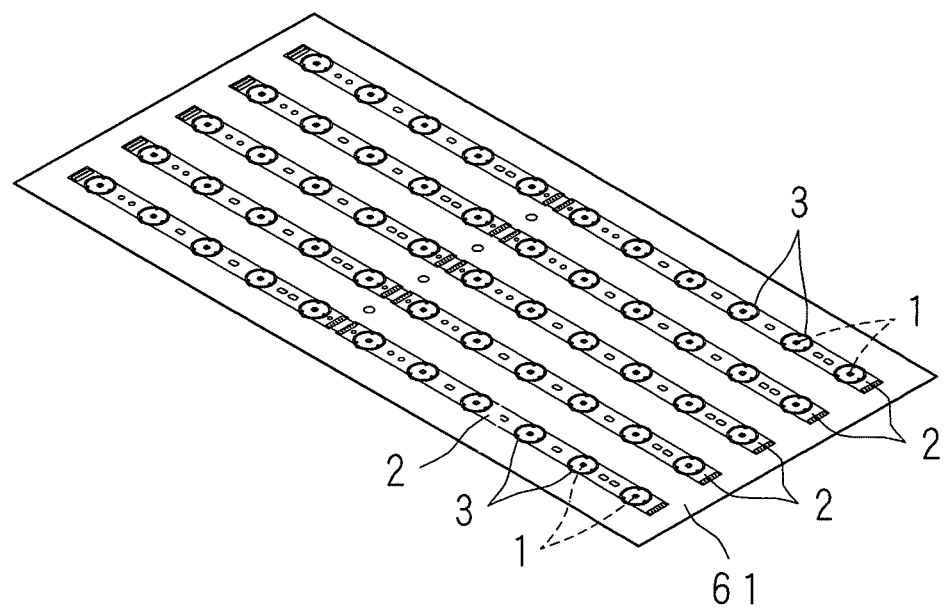

F I G. 1 3
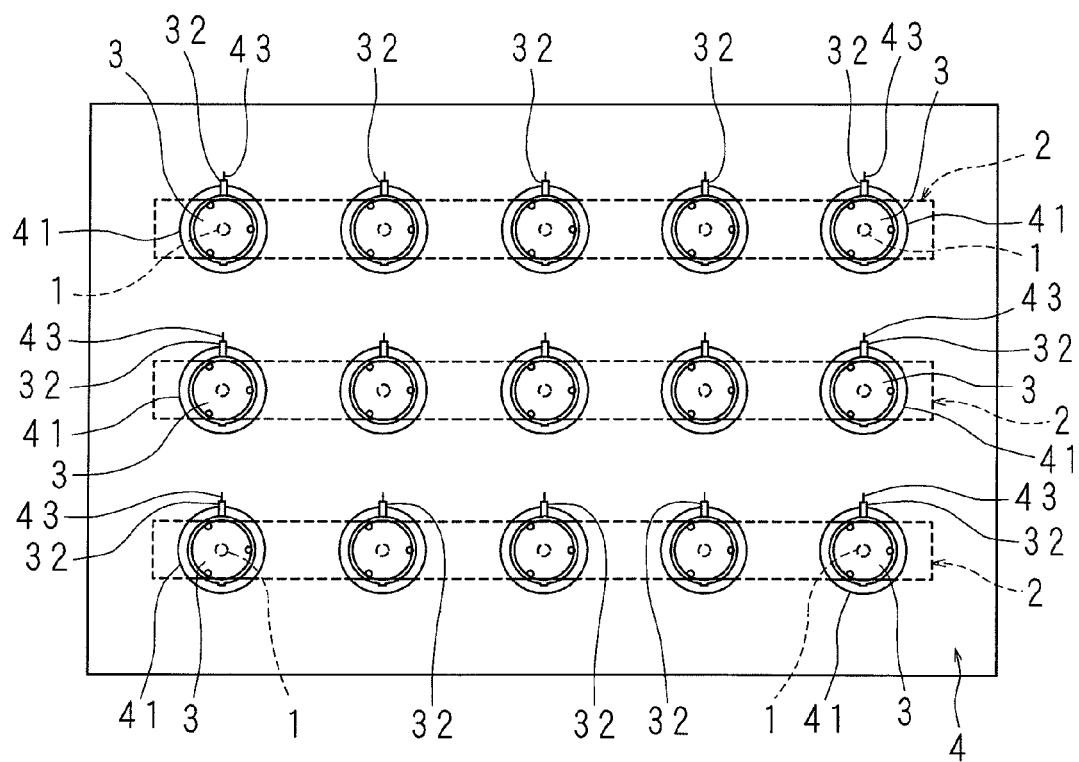

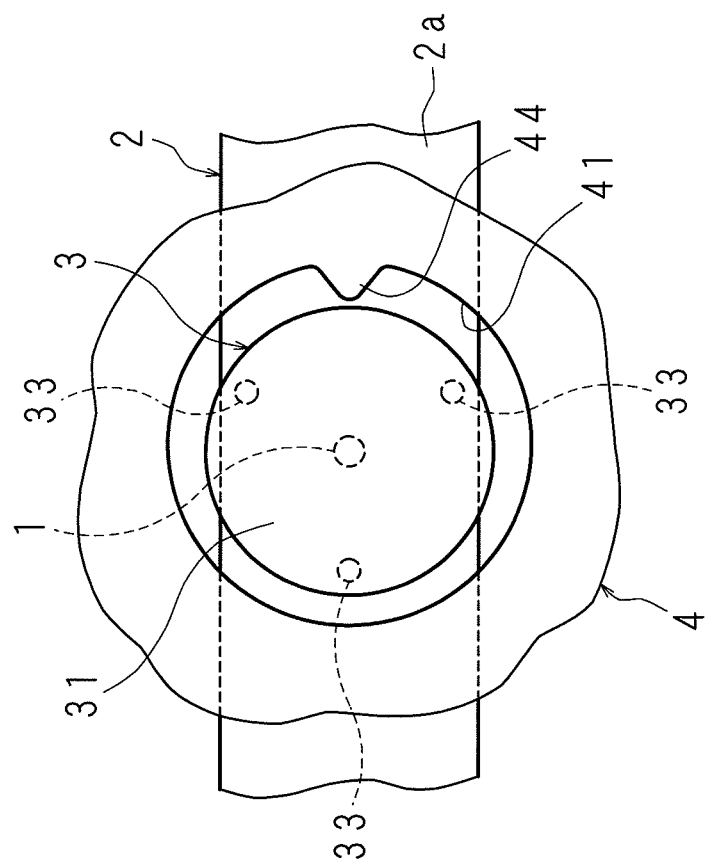

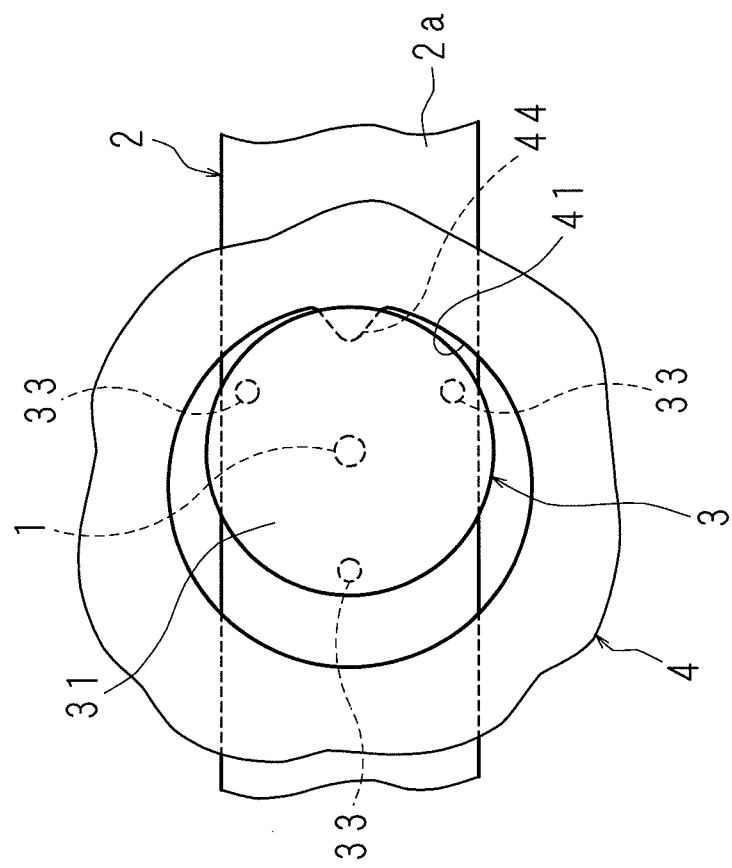

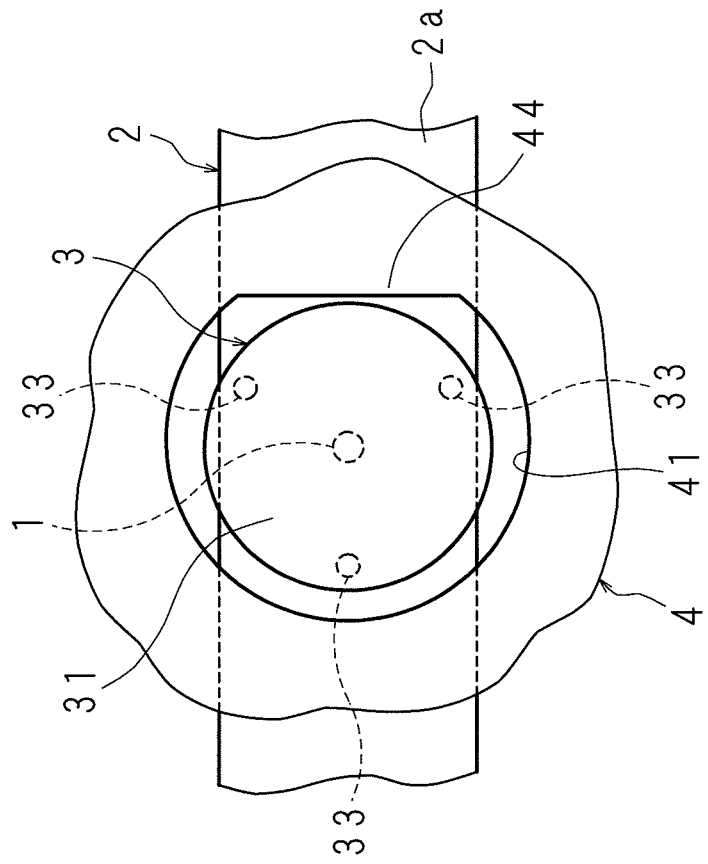

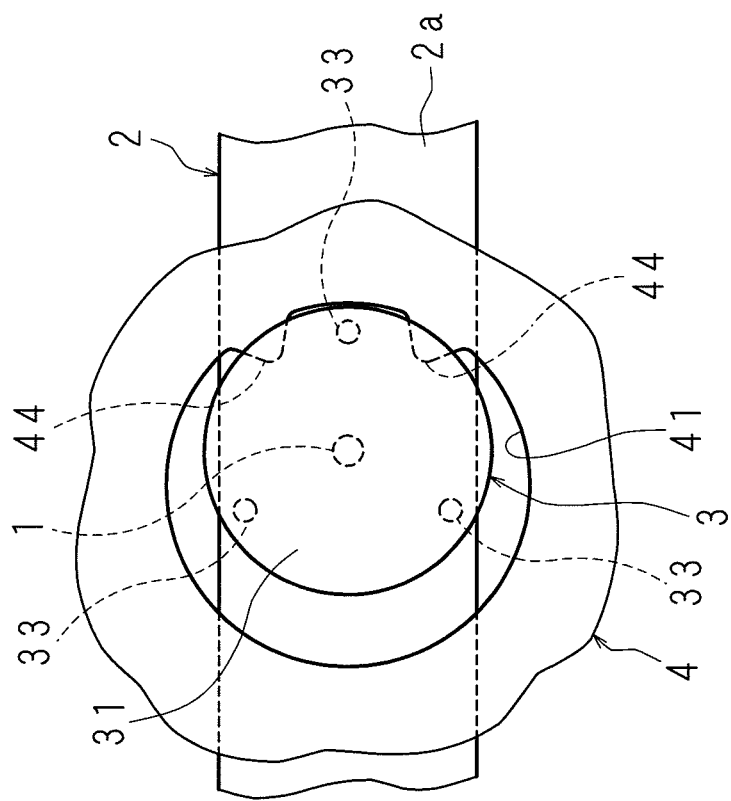

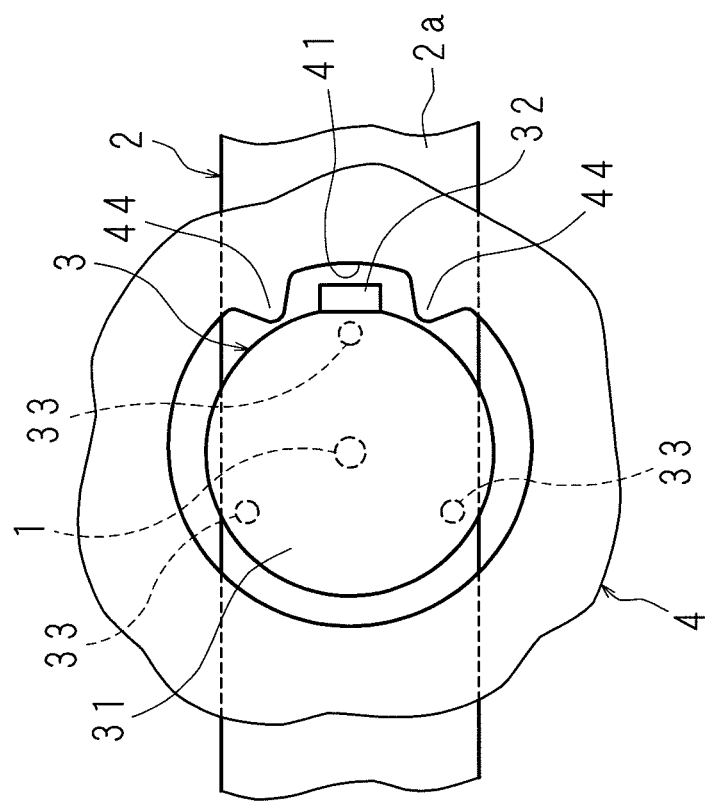

LIGHT SOURCE DEVICE AND DISPLAY DEVICE PROVIDED WITH SAME

CROSS-REFERENCE TO RELATED APPLICATION

This application is the national phase under 35 U.S.C. §371 of PCT International Application No. PCT/JP2010/058501 filed in Japan on May 5, 2010, the entire contents of which are hereby incorporated by reference.

BACKGROUND

1. Technical Field

The present invention relates to: a light source device provided with a circuit board on which a LED is mounted; and a display device provided with this light source device.

2. Description of the Related Art

In a display device such a television set, a light source device is disposed on the rear side of a display part having, on the front side, a display surface displaying an image.

A light source device has, for example: a LED board having a plurality of LEDs mounted on one surface; a lens accommodating the LED and diffuses light emitted from the LED; and a lens cover that has a through hole into which the lens is inserted and that holds the lens on the LED board. Then, a reflecting layer reflecting the light diffused by the lens is provided in the lens cover (see, for example, Japanese Patent Laid-Open No. 2008-41546).

The lens has a semi-spherical shape of a smaller diameter than the through hole, protrudes outward from a transparent part inserted into the through hole and the periphery on the open side of the transparent part, and has a flange having a larger diameter than the through hole. Then, such a configuration is employed that when the lens cover is attached to the LED board with a plurality of male screws, the flange is pinched between the peripheral edge of the through hole in the lens cover and the LED board so that the lens is positioned and fixed.

Here, in a configuration that the lens cover positions and fixes the lens as described in Patent Document 1, when the lens cover is fabricated from a relatively thick sheet, the lens cover hardly deforms and hence positioning and fixing of the lens is achieved by using a relatively small number of male screws. Nevertheless, in flat-screen display devices such as a liquid crystal television set employing a light source device, the trends of price reduction, weight reduction, and thickness reduction are continuing. Thus, when the lens cover is fabricated from a relatively thick sheet, a problem is caused in the price reduction, weight reduction, and thickness reduction of the display device and hence this configuration is not preferable.

When the lens cover is fabricated from a relatively thin sheet, the lens cover in which a through hole corresponding to the lens is opened deforms easily. Thus, deformation such as warp of the lens cover is not suppressed unless the number of male screws is increased. This causes an increase in the number of components and an increase in the number of process steps of screwing the male screws, so as to cause a problem of cost increase. Further, when a relatively large number of LEDs are employed, a problem arises that the position of each lens disposed distant from the male screws easily becomes unstable.

SUMMARY

The present invention has been devised in view of this situation. A major object of the present invention is to provide a light source device and a display device in which a reflecting sheet is assembled without using a screw in such a manner that the reflecting sheet does not rise.

The light source device according to the present invention is characterized by a light source device includes a circuit board having a LED mounted on a surface, a lens attached to the surface so as to diffuse light emitted from the LED, and a reflecting sheet having a through hole in the inside of which the lens is disposed and reflecting light emitted from the LED at an opposite side of the surface, wherein at least one of an edge of the through hole in the reflecting sheet and the lens includes a restricting member for restricting a deviation of the reflecting sheet in a direction departing from the surface.

In this invention, when the reflecting sheet is opposite to a surface of the circuit board having a LED mounted on the surface and the lens is disposed in the through hole of the reflecting sheet, the reflecting sheet is restricted by the restricting member from deviating in a direction departing from the surface. Thus, the reflecting sheet is easily assembled in such a manner that the reflecting sheet does not rise.

Further, in the light source device according to the present invention, such a configuration is preferable that the restricting member is a convex portion disposed in the lens and opposite to a sheet surface of the reflecting sheet.

In this invention, when the reflecting sheet is opposite to the surface of the circuit board having a LED mounted on the surface and the lens is disposed in the through hole of the reflecting sheet, the edge of the through hole in the reflecting sheet is fit in between the convex portion of the lens and the surface. Thus, the reflecting sheet is easily assembled in such a manner that the reflecting sheet does not rise.

Further, in the light source device according to the present invention, such a configuration is preferable that the restricting member is a convex portion disposed at an edge of the through hole and opposite to an attachment side of the lens for attachment to the surface.

In this invention, when the reflecting sheet is opposite to one surface of the circuit board having a LED mounted on the surface and the lens is disposed in the through hole of the reflecting sheet, the convex portion disposed at the edge of the through hole in the reflecting sheet is fit in between the attachment side of the lens for attachment to the surface and the surface. Thus, the reflecting sheet is easily assembled in such a manner that the reflecting sheet does not rise.

Further, in the light source device according to the present invention, such a configuration is preferable that the reflecting sheet has flexibility and, at an edge of the through hole, a slit is provided in a part opposite to the convex portion.

In this invention, the slit allows the circumference of the through hole in the reflecting sheet to easily be warped. Thus, when the reflecting sheet opposite to the surface of the circuit board in which a LED is mounted on the surface and to which the lens is attached is warped and then the circumference of the through hole in the reflecting sheet is warped in the slit part, the circumference of the through hole in the reflecting sheet is easily fit in between the convex portion and the circuit board. Thus, the reflecting sheet is easily assembled in such a manner that the reflecting sheet does not rise.

Further, in the light source device according to the present invention, such a configuration is preferable that the reflecting sheet is movable along the circuit board.

In this invention, at the time that the LED is mounted on one surface, the reflecting sheet opposite to the surface of the circuit board in which a LED is mounted on the surface and to which the lens is attached is warped, and then the lens is disposed in the through hole of the reflecting sheet, when the reflecting sheet is shifted slightly in a direction along the surface, the edge of the through hole in the reflecting sheet is easily fit in between the convex portion of the lens and the circuit board or alternatively the convex portion disposed at the edge of the through hole in the reflecting sheet is easily fit in between the attachment side of the lens for attachment to the surface and the surface. Thus, the reflecting sheet is easily assembled in such a manner that the reflecting sheet does not rise.

Further, in the light source device according to the present invention, such a configuration is preferable that the lens has a positioning protrusion oriented to the circuit board.

In this invention, the position of the convex portion relative to the circuit board is determined accurately by the positioning protrusion. Thus, even when a relatively large number of LEDs are employed, the circumference of the through hole in the reflecting sheet is easily fit in between the convex portion of each lens and the circuit board. Thus, the reflecting sheet is easily assembled in such a manner that the reflecting sheet does not rise.

The display device according to the present invention is characterized by including a display part having a display surface on one side; and a light source device according to the above-mentioned invention which is disposed on the other side of the display part.

In this invention, the convex portion of the lens prevents the reflecting sheet from rising from the circuit board and hence avoids deformation of the reflecting sheet. Further, the rise of the reflecting sheet is prevented by the existing lens. Thus, deformation of the reflecting sheet is avoided without increasing the number of components. This realizes price reduction, weight reduction, and thickness reduction in the display device.

According to the present invention, the restricting member provided in at least one of the edge of the through hole in the reflecting sheet and the lens prevents the reflecting sheet from rising from the circuit board and hence avoids deformation of the reflecting sheet. This realizes price reduction, weight reduction, and thickness reduction in the display device.

The above and further objects and features of the invention will more fully be apparent from the following detailed description with accompanying drawings.

BRIEF DESCRIPTION OF THE SEVERAL VIEWS OF THE DRAWINGS

FIG. 3 is a schematic perspective view of a light source device according to the present invention, where a part is disassembled;

FIG. 13 is a schematic plan view illustrating another configuration of a main part of a light source device according to the present invention;

FIG. 14A is an enlarged plan view illustrating another configuration of a main part of a light source device according to the present invention;

FIG. 14B is an explanation diagram illustrating a state that a reflecting sheet is under assembling;

FIG. 15A is an enlarged plan view illustrating another configuration of a main part of a light source device according to the present invention;

FIG. 16B is an explanation diagram illustrating a state that a reflecting sheet is under assembling;

FIG. 17A is an enlarged plan view illustrating another configuration of a main part of a light source device according to the present invention.

DETAILED DESCRIPTION

The present invention is described below in detail with reference to the drawings illustrating the embodiments.

Embodiment 1

Figure 1:
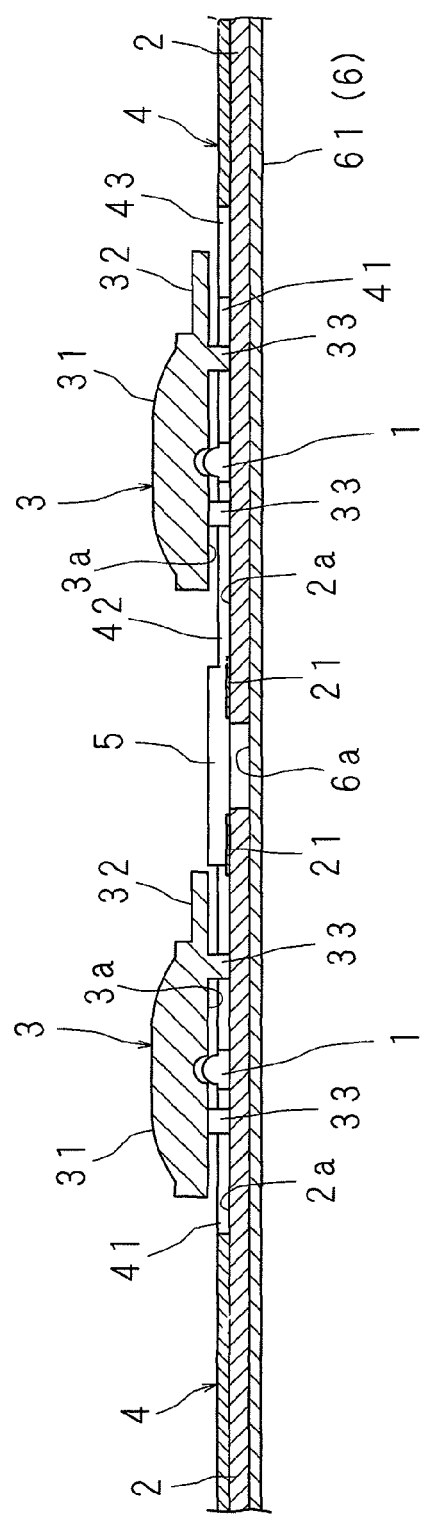
FIG. 1 is an enlarged sectional view of a part illustrating a configuration of a light source device according to the present invention.
Figure 2:
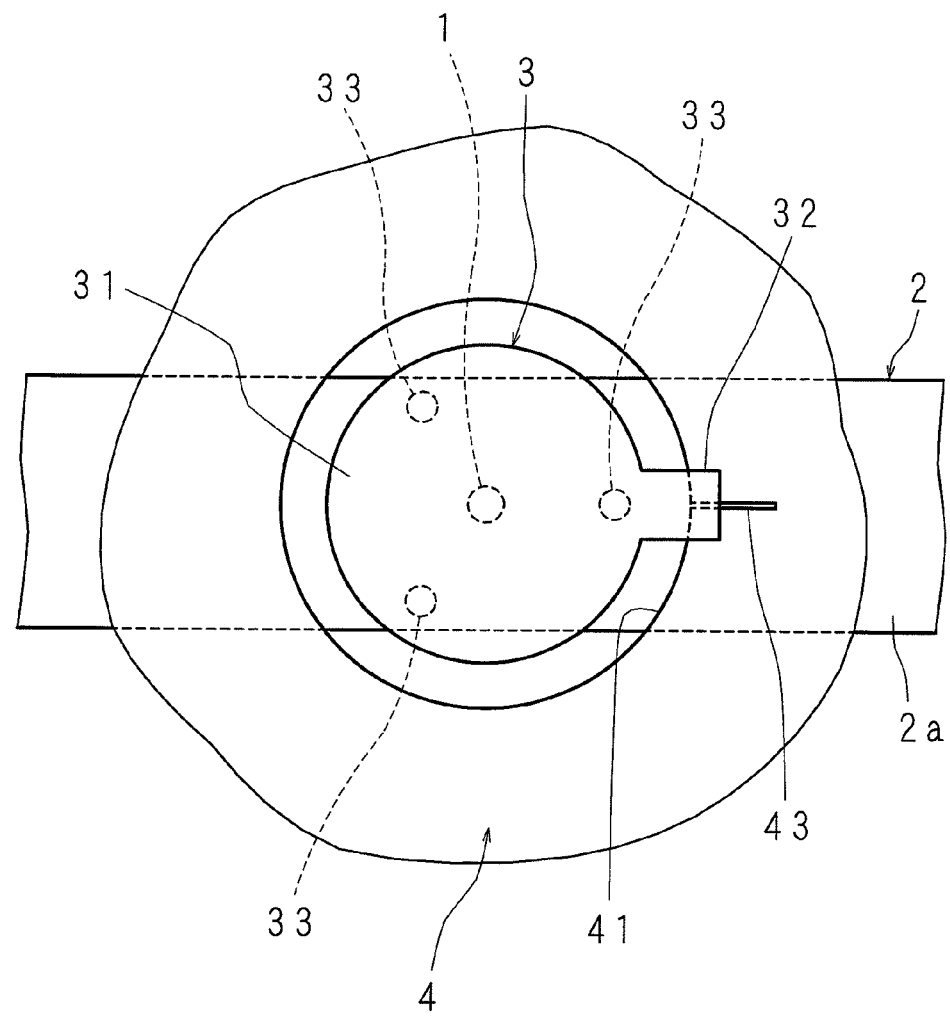
FIG. 2 is an enlarged plan view illustrating a configuration of a main part of a light source device according to the present invention.
Figure 4:
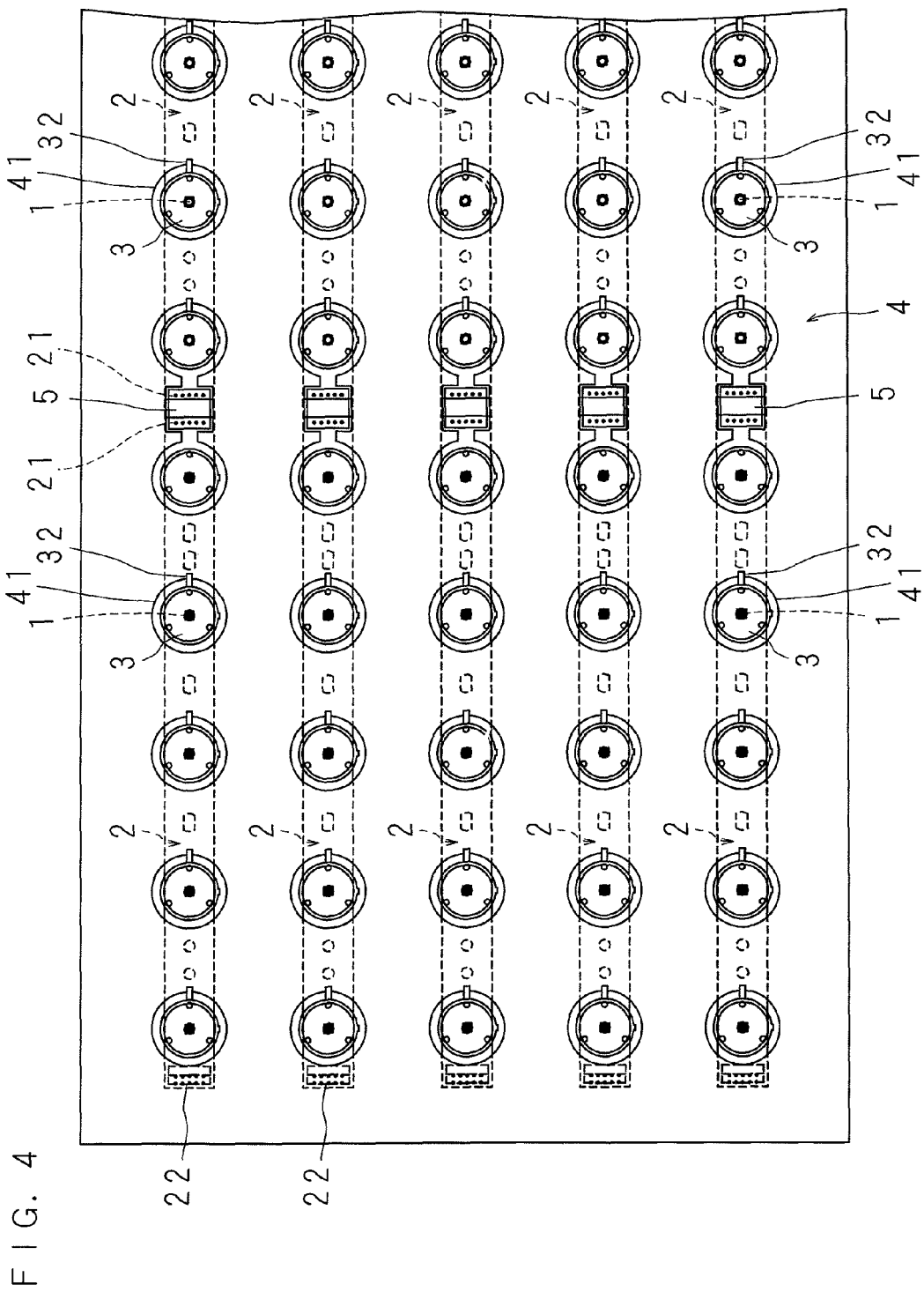
FIG. 4 is a plan view of a light source device according to the present invention, where a part is omitted.
Figure 5:
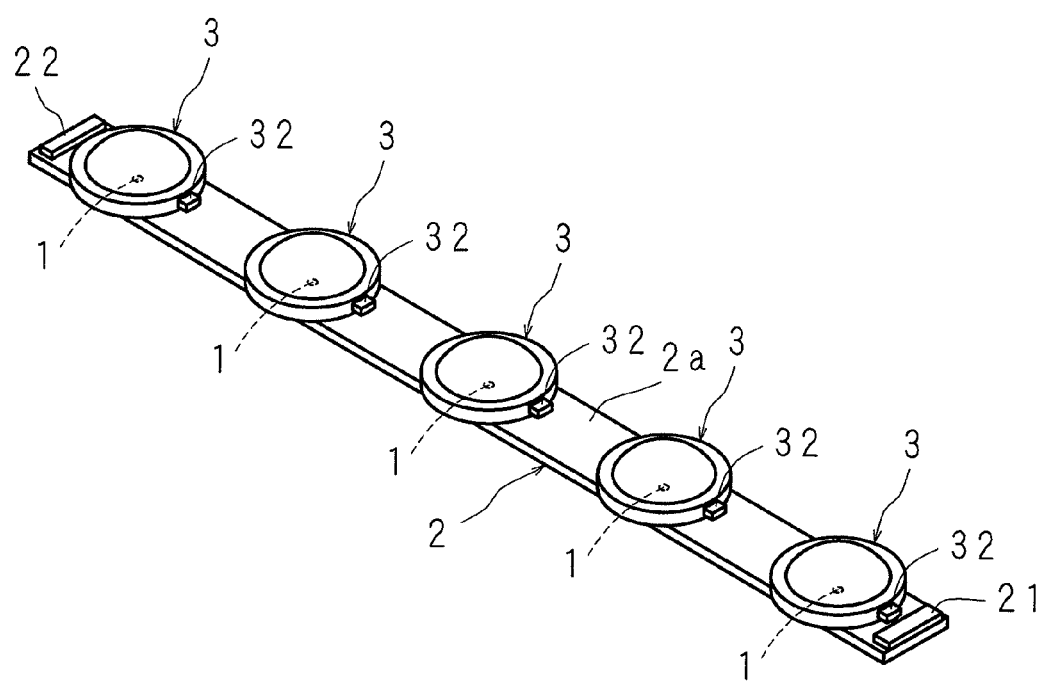
FIG. 5 is a perspective view illustrating a configuration of a LED board to which a lens is attached.

FIG. 1 is a sectional view illustrating the configuration of a light source device, where a part is enlarged. FIG. 2 is an enlarged plan view illustrating the configuration of a main part. FIG. 3 is a schematic perspective view of a light source device, where a part is disassembled. FIG. 4 is a plan view of a light source device, where a part is omitted. FIG. 5 is a perspective view illustrating the configuration of a LED board to which a lens is attached.

The light source device illustrated in the figures is attached to the rear side of a display part in a flat-screen display device provided with a display part having a display surface on the front side and having an approximately rectangular parallelepiped shape. The light source device has: a plurality of LEDs 1 aligned in a matrix pattern; a plurality of LED boards 2 in which the LEDs 1 are mounted on a surface 2a and which are aligned in a grid pattern; a plurality of lenses 3 attached to the surface 2a of the LED board 2 and opposite to the apices of the LEDs 1 so as to diffuse light emitted from the LEDs 1; a reflecting sheet 4 having through holes 41 inside of which the lenses 3 are disposed and which are placed on the surface 2a so as to reflect light emitted from the LEDs 1; a plurality of connectors 5 connecting adjacent LED boards 2 and 2 to each other; and a supporting body 6 supporting the LED boards 2 in an aligned manner. Here, the LED boards 2 constitute a circuit board.

The LED boards 2 serving as a circuit board have a strip shape as illustrated in FIGS. 3 to 5, and are aligned on surface 6a of the supporting body 6 having an approximately rectangular shape in a manner that a gap is formed in the longitudinal direction and the width direction. As illustrated in FIG. 5, on the surface 2a of each LED board 2, a plurality of LEDs 1 are mounted separately from each other in the longitudinal direction. Then, connection parts 21 and 22 are provided at both ends of the surface 2a in the longitudinal direction.

In the adjacent LED boards 2, in the LED boards 2 in one row in the longitudinal direction, two adjacent connection parts 21 and 21 are connected to each other through a connector 5. Then, one LED board 2 is connected to a later-described power circuit board through a second connector, and the other LED board 2 is connected to a later-described control circuit board through a third connector.

For example, as illustrated in FIG. 3, the LEDs 1 in a number of five or six are mounted separately from each other in the longitudinal direction of the LED board 2. Then, the lenses 3 in a number of five or six corresponding to the LEDs 1 are attached to the surface 2a with adhesives.

The lens 3 has: a transparent part 31 having a hemispherical recess opposite to the apex of the LED 1 with a gap in between so as to diffuse, toward all directions, light emitted from the LED 1; a convex portion 32 serving as restricting member protruding outward from a part of the peripheral surface of the transparent part 31 and being opposite to the sheet surface at the edge of the through hole 41 in the reflecting sheet 4 so as to restrict the reflecting sheet 4 from deviating in a direction departing from the surface 2a; and three positioning protrusions 33 protruding from the attachment side surface 3a opposite to the surface 2a of the transparent part 31 toward the LED board 2 and determining the position of the convex portion 32 relative to the LED board 2. Then, the tip of positioning protrusion 33 is attached to the surface 2a with adhesives.

The transparent part 31 is formed in a slightly smaller size than the through hole 41. The convex portion 32 is disposed at a position opposite to the surface 2a, and formed in a length exceeding the edge of the through hole 41. Then, the edge of the through hole 41 of the reflecting sheet 4 is inserted between the convex portion 32 and the surface 2a so that the reflecting sheet 4 is prevented from rising from the LED board 2.

In the positioning protrusion 33, the distance between the convex portion 32 and the LED board 2 is slightly longer than the thickness of the reflecting sheet 4 so that the thermal expansion of the reflecting sheet 4 is allowed to be absorbed.

The reflecting sheet 4 is composed of one plastic sheet having a high reflectivity and having an approximately rectangular shape corresponding to the supporting body 6. In the reflecting sheet 4, the through hole 41 is opened in a part corresponding to each lens 3 and a second through hole 42 is opened in a part corresponding to the connector 5. At a position opposite to the convex portion at the edge of the through hole 41, a slit 43 is provided that is cut in a radial direction.

The through holes 41 have a round shape of a larger diameter than the transparent part 31 and are disposed in a matrix pattern. Then, the transparent part 31 is disposed in the inside of each. The slit 43 is disposed in a part corresponding to the center in the width direction of the convex portion 32, and formed longer than the length of the convex portion 32. The second through hole 42 has an approximately rectangular shape, and the connector 5 is inserted thereinto.

The supporting body 6 is fabricated by shaping a metal plate, and has: a plate part 61 having an approximately rectangular flat-plate shape; and a frame part continuing to the periphery of the plate part 61. Then, the LED boards 2 are accommodated and supported on surface 6a of the plate part 61 in a manner of being aligned in the longitudinal direction and the width direction.

In one side part in the longitudinal direction of in the plate part 61, a power circuit board is attached that is connected to a driver for the LED board 2 through the second connector and supplies a voltage to the driver. In the other side part in the longitudinal direction, a control circuit board is attached that is connected to a driver for the LED board 2 through the third connector and controls the driver. Further, in the center part in the longitudinal direction of the other surface of the plate part 61, a plurality of circuit boards are attached like a power circuit board supplying a voltage to the display part, a terminal circuit board processing the image to be displayed on the display surface of the display part, and a control circuit board controlling the display part.

Figure 6:
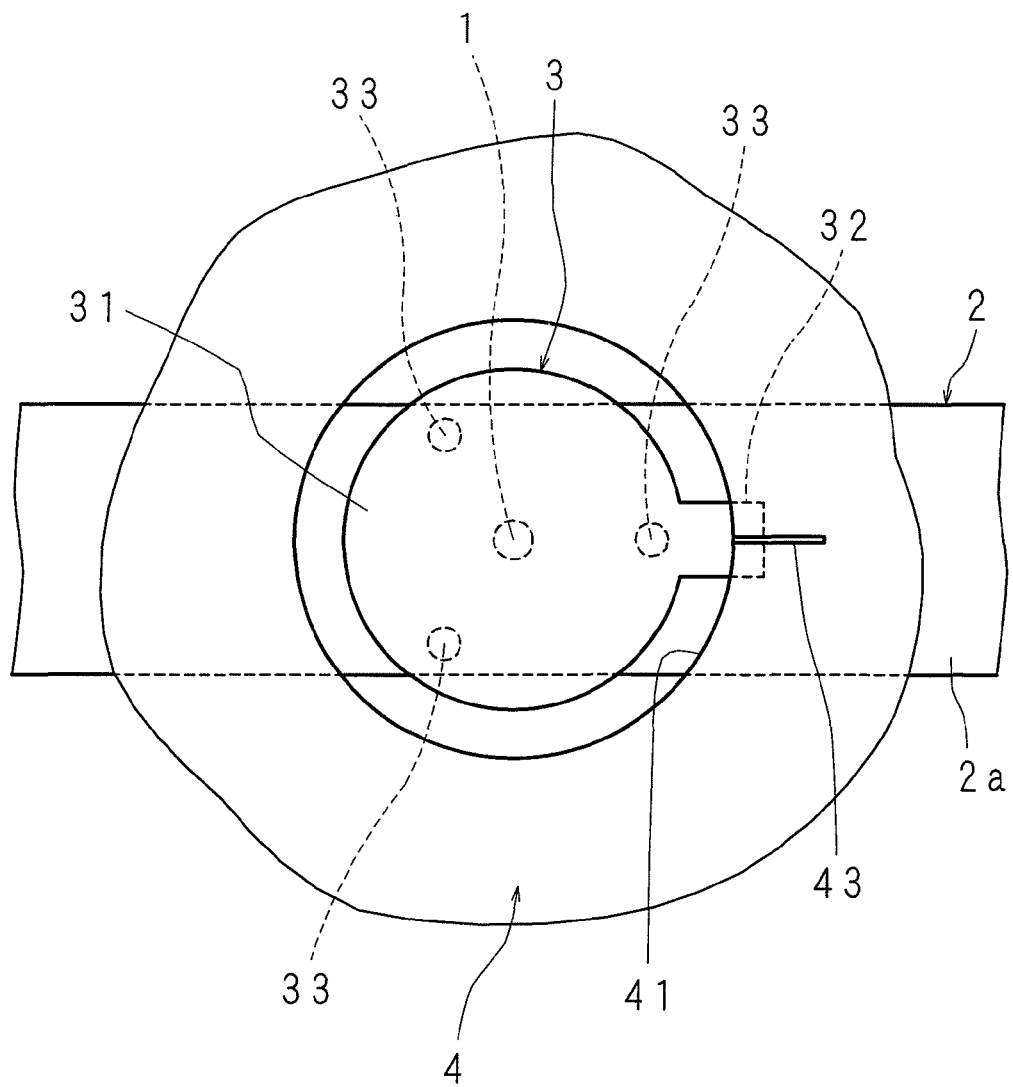
FIG. 6 is an explanation diagram illustrating a state that a reflecting sheet is under assembling.

FIG. 6 is an explanation diagram illustrating a state that the reflecting sheet 4 is under assembling. In the light source device constructed as described above, plural rows of the LED boards 2 in which the plurality of LEDs 1 are mounted on the surface 2a and to which the lenses 3 opposite to the apices of the LEDs 1 are attached are aligned on the surface 6a of the plate part 61 in the supporting body 6. Then, the LED boards 2 are attached to the plate part 61 by movement stopping member such as stoppers. After that, the reflecting sheet 4 is placed opposite to the surface 2a of the LED board 2. At that time, the transparent part 31 in the lens 3 fits into each through hole 41 of the reflecting sheet 4. Then, as illustrated in FIG. 6, the slit 43 part at the edge of the through hole 41 in the reflecting sheet 4 abuts against the convex portion 32 of the lens 3. In this state, when the slit 43 part of the through hole 41 in the reflecting sheet 4 is presses toward the LED board 2, the slit 43 part in the convex portion 32 is warped in a direction departing from the convex portion 32 and hence the slit 43 part is fit into a space between the convex portion 32 and the LED board 2.

In this state, the convex portion 32 of each of the lenses 3 disposed in a matrix pattern with a relatively short separation distance is opposite to the sheet surface at the edge of the through hole 41 in the reflecting sheet 4. This effectively prevents the rise of the reflecting sheet 4. Further, after the reflecting sheet 4 is placed opposite to the surface 2a of the LED board 2, when the slit 43 part of the reflecting sheet 4 is merely pressed, the reflecting sheet 4 is assembled in such a manner that the reflecting sheet 4 does not rise.

Figure 7:
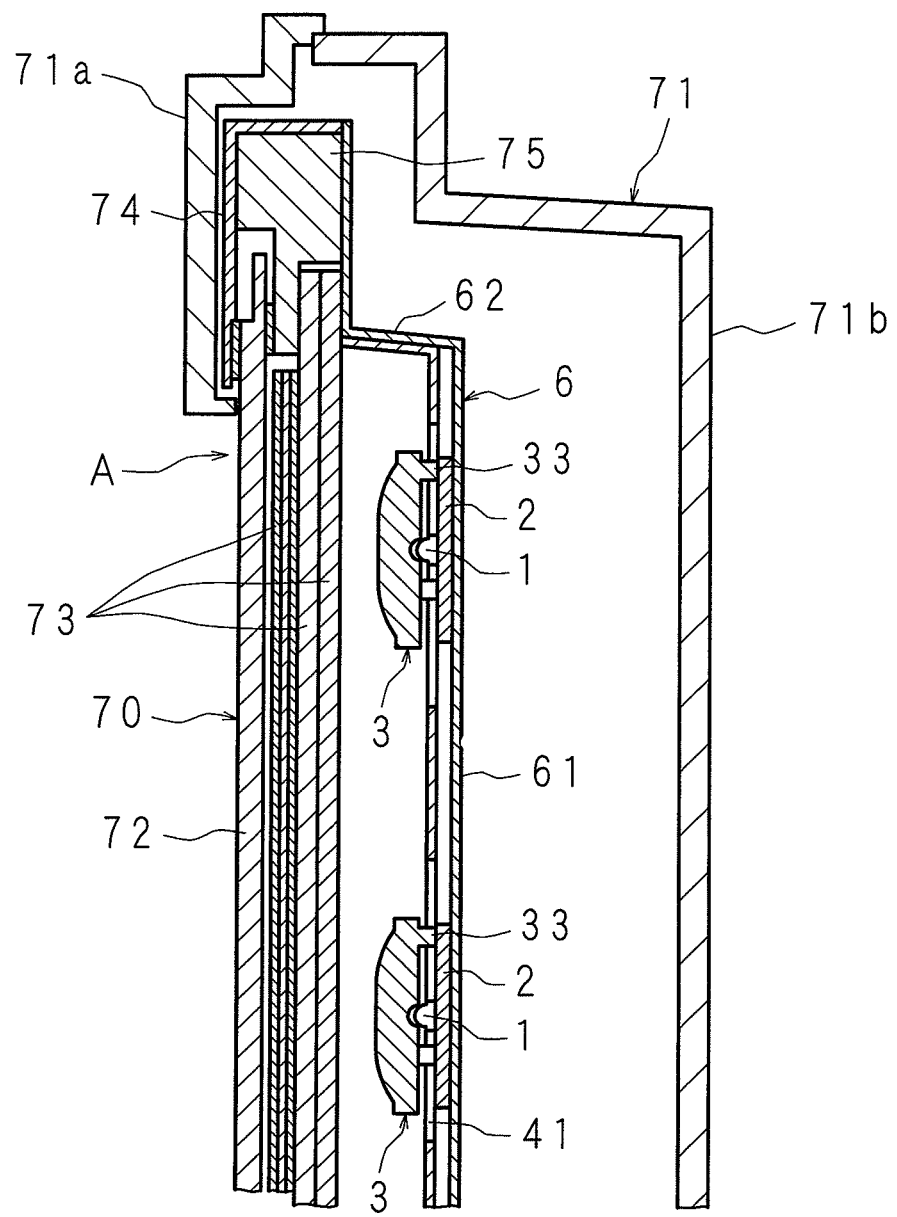
FIG. 7 is a sectional view illustrating a configuration of a display device employing a light source device according to the present invention.

FIG. 7 is a sectional view illustrating the configuration of a display device employing a light source device according to the present invention. This display device has: a display part 70 having, on the front side, a display surface displaying a television image; a light source device A disposed on the rear side of the display part 70 in such a manner that the supporting body 6 is in a vertical orientation; and a cabinet 71 covering the peripheral edge of the display part 70 and the rear side of the light source device A.

The display part 70 has: a display panel 72 having a display surface; and an optical sheet 73 disposed on the rear side of the display panel 72. The peripheral edge of the display panel 72 is clamped and held in the forward and backward directions by a front holding frame 74 and a rear holding frame 75, so as to form a panel module. Then, the rear holding frame 75 is attached to the peripheral edge of the supporting body 6.

The optical sheet 73 is a stack body obtained by stacking: a relatively thick diffusing plate diffusing light emitted from the LED 1 serving as a light source; and relatively thin plastic sheets such as a reflecting polarization plate, a prism sheet, and a diffusion sheet.

The supporting body 6 has a plate part 61 and a frame part 62 continuing to the periphery of the plate part 61. Then, the peripheral edge of the diffusing plate is supported by the frame part 62.

The cabinet 71 has: a cabinet front piece 71a covering the front side of the peripheral edge of the display part 70; and a cabinet rear piece 71b having a deep dish shape and covering the peripheral edge and the rear side of the light source device A. Then, the cabinet 71 is attached to the frame part 62 of the supporting body 6 with male screws.

Embodiment 2

Figure 8:
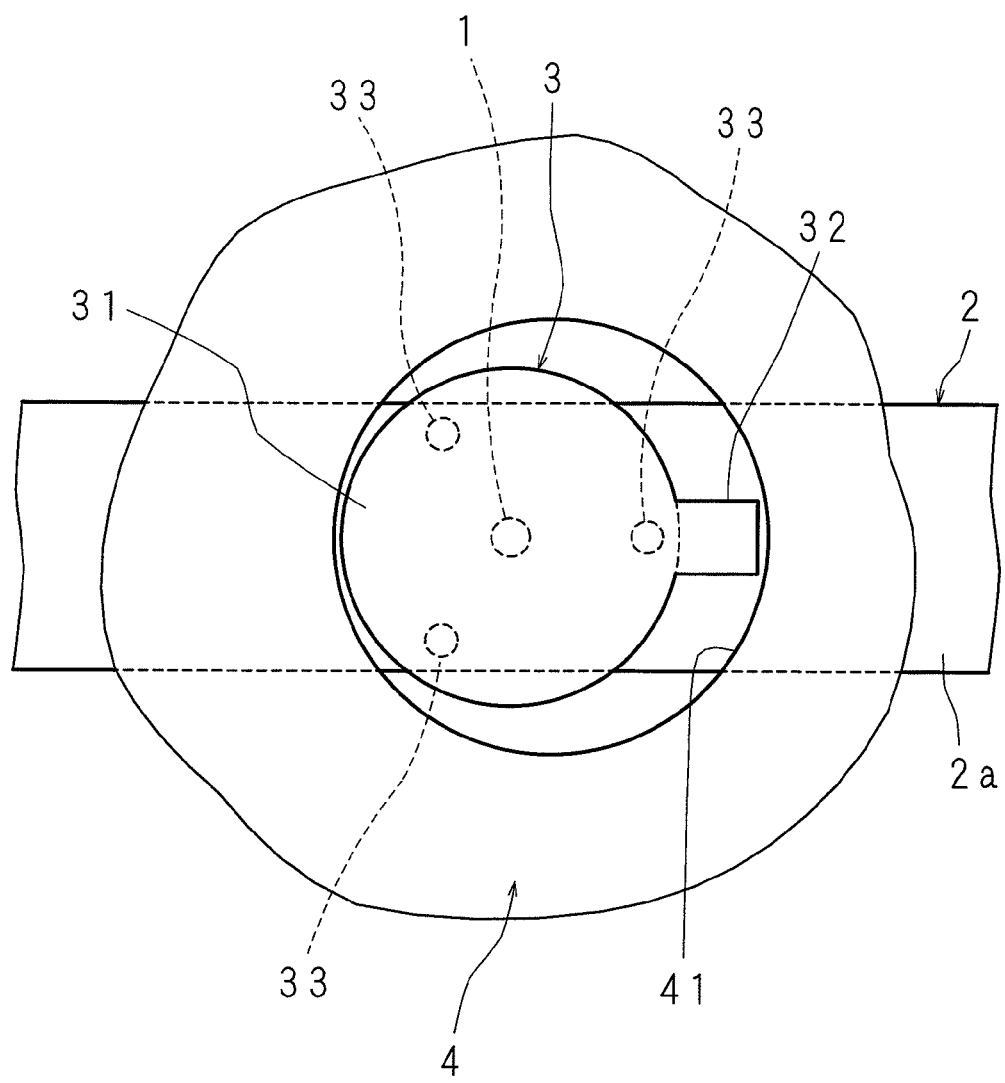
FIG. 8 is an enlarged plan view illustrating another configuration of a main part of a light source device according to the present invention.
Figure 9:
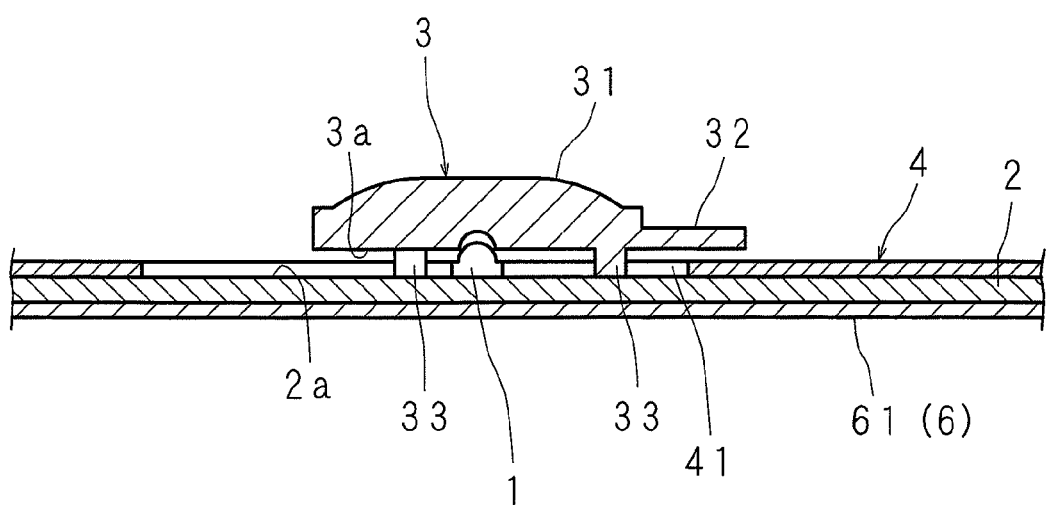
FIG. 9 is an enlarged sectional view illustrating another configuration of a main part of a light source device according to the present invention.
Figure 10:
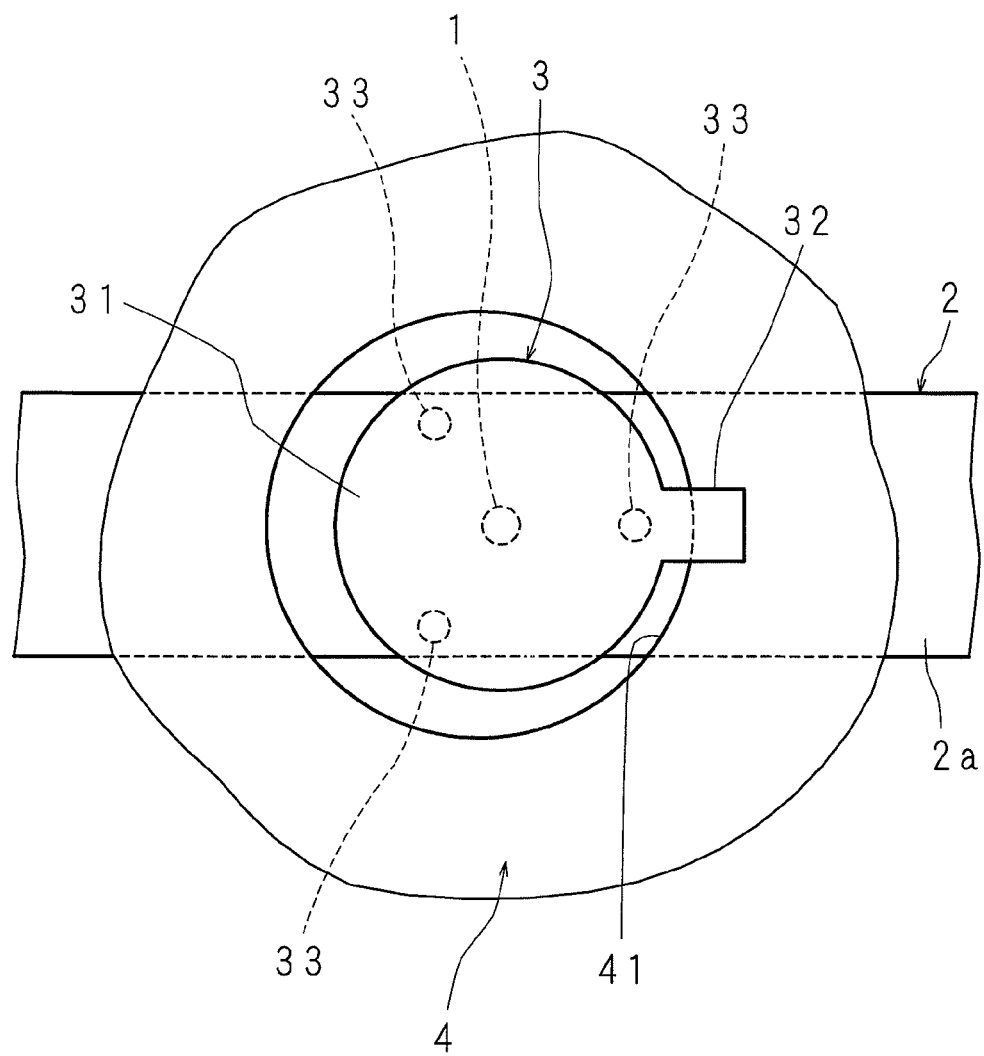
FIG. 10 is an explanation diagram illustrating a state that a reflecting sheet is under assembling.

FIG. 8 is an enlarged plan view illustrating another configuration of the main part of a light source device. FIG. 9 is an enlarged sectional view illustrating another configuration of the main part of a light source device. FIG. 10 is an explanation diagram illustrating a state that the reflecting sheet 4 is under assembling.

In this light source device, in place of a configuration that the slit 43 is provided at the edge of the through hole 41 in the reflecting sheet 4, the through hole 41 is formed in a round shape of a slightly larger diameter than the lens 3 with the convex portion 32. By virtue of this, when the reflecting sheet 4 is to be placed opposite to the surface 2a of the LED board 2, the transparent part 31 and the convex portion 32 are fit into the through hole 41 and then the reflecting sheet 4 is moved in a direction along the LED board 2 in a state that the reflecting sheet 4 is placed on the surface 2a. Then, the through hole 41 peripheral edge of the reflecting sheet 4 is fit into a space between the convex portion 32 and the LED board 2.

In the present embodiment, after the reflecting sheet 4 is placed opposite to the surface 2a of the LED board 2, the reflecting sheet 4 is moved in a direction along the LED board 2. By virtue of this, the through hole 41 peripheral edge of the reflecting sheet 4 is fit into a space between the convex portion 32 of each of the lenses 3 disposed in a matrix pattern with a relatively short separation distance and the LED board 2. Thus, the reflecting sheet 4 is assembled in such a manner that the reflecting sheet 4 does not rise. Accordingly, workability of assembling of the reflecting sheet 4 is improved further.

The other points in the configuration and the operation are similar to those in Embodiment 1. Thus, like components are designated by like numerals, and their detailed description and the description of operational effects are omitted.

Embodiment 3

Figure 11:
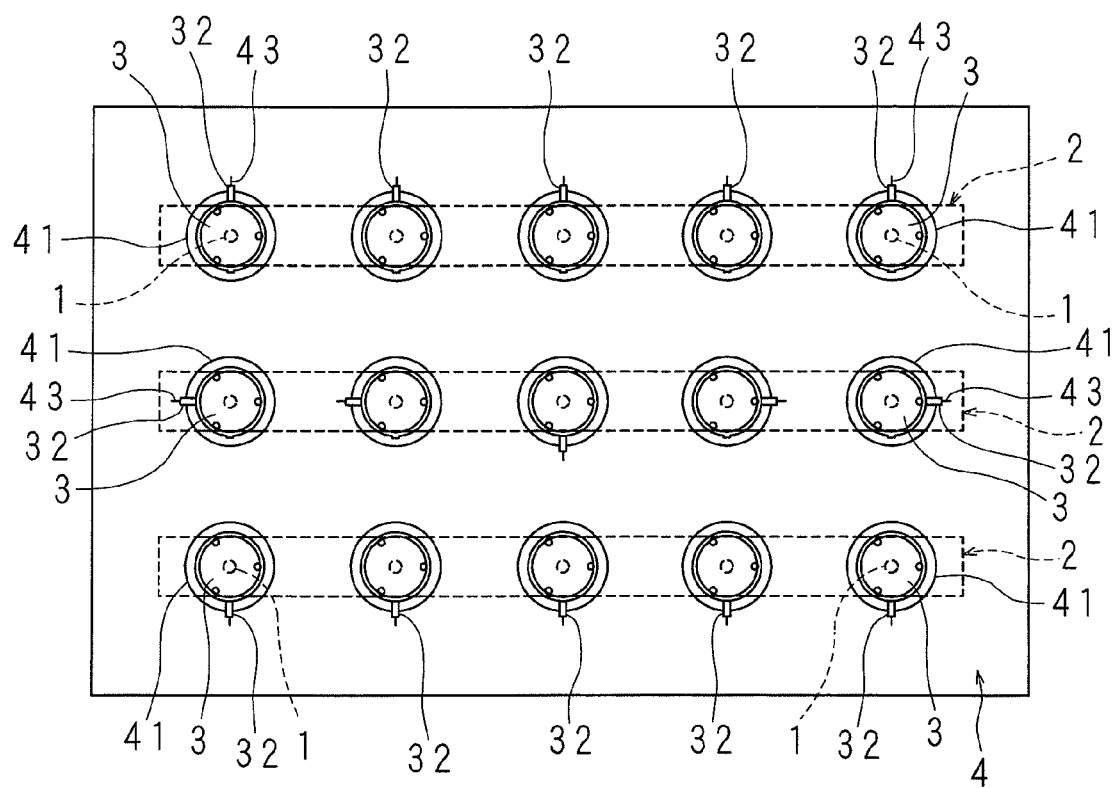
FIG. 11 is a schematic plan view illustrating another configuration of a main part of a light source device according to the present invention.

FIG. 11 is a schematic plan view illustrating another configuration of the main part of a light source device. In this light source device, in place of a configuration that the lenses 3 are aligned such that the convex portions 32 serving as restricting means are oriented in the same direction, the lenses 3 are aligned such that the convex portions 32 are oriented in different directions, that is, the convex portions 32 are oriented toward the four sides of the plate part 61 having an approximate rectangular shape.

In the configuration that the plurality of LED boards 2 having a strip shape are disposed in parallel to each other in the plate part 61 having an approximate rectangular shape, in each lens 3 attached to the LED board 2 disposed on one longer-side side of the plate part 61, the convex portions 32 are oriented toward the one longer side. In each lens 3 attached to the LED board 2 disposed on the other longer-side side of the plate part 61, the convex portions 32 are oriented toward the other longer side. Further, in each lens 3 attached to the LED board 2 disposed on the center side of the plate part 61, the convex portions 32 are oriented toward one shorter side, the other shorter side, and the other longer side. In other words, the lenses 3 are disposed such that the convex portions 32 are oriented toward the periphery of the supporting body 6 and hence toward the periphery of the display part in the display device.

At the edge of the through hole 41 in the reflecting sheet 4, a slit 43 is provided in a part opposite to the center in the width direction of the convex portion 32 of each lens 3.

In the present embodiment, when the reflecting sheet 4 is placed opposite to the surface 2a of the LED board 2 and the lens 3 is disposed in each through hole 41 of the reflecting sheet 4, the slit 43 part at the edge of the through hole 41 in the reflecting sheet 4 abuts against the convex portion 32 of each lens 3. In this state, when the slit 43 part of the through hole 41 in the reflecting sheet 4 is presses toward the LED board 2, the slit 43 part in the convex portion 32 is warped in a direction departing from the convex portion 32 and hence the slit 43 part is fit into a space between the convex portion 32 and the LED board 2. Thus, the reflecting sheet 4 is restricted from deviating in a direction departing from the surface 2a.

The convex portion 32 of the lens 3 easily causes luminance inhomogeneity in comparison with the lens 3 without the convex portion 32. However, in the lens 3 in Embodiment 3, the convex portions 32 are oriented in different directions. Thus, the luminance inhomogeneity caused by the convex portion 32 is reduced further.

The other points in the configuration and the operation are similar to those in Embodiment 1. Thus, like components are designated by like numerals, and their detailed description and the description of operational effects are omitted.

Embodiment 4

Figure 12:
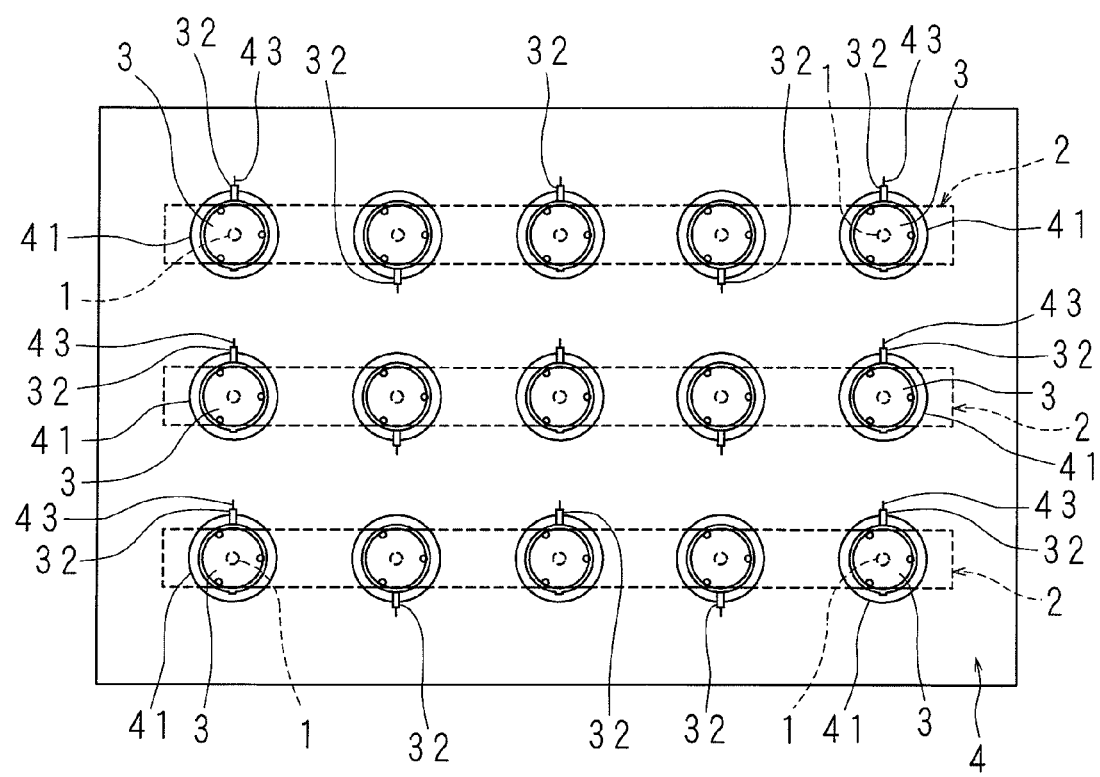
FIG. 12 is a schematic plan view illustrating another configuration of a main part of a light source device according to the present invention.

FIG. 12 is a schematic plan view illustrating another configuration of the main part of a light source device. In this light source device, the convex portions 32 of the lenses 3 on each LED board 2 are disposed in a staggered arrangement.

In the configuration that the plurality of LED boards 2 having a strip shape are disposed in parallel to each other in the plate part 61 having an approximate rectangular shape, in the plurality of lenses 3 attached to each LED board 2, the convex portions 32 of the lenses 3 are disposed in a staggered arrangement.

At the edge of the through hole 41 in the reflecting sheet 4, the slits 43 each provided in a part opposite to the center in the width direction of the convex portion 32 of each lens 3 are provided in a part forming a staggered arrangement corresponding to the staggered arrangement of the convex portion 32.

In the present embodiment, when the reflecting sheet 4 is placed opposite to the surface 2a of the LED board 2 and the lens 3 is disposed in each through hole 41 of the reflecting sheet 4, the slit 43 part at the edge of the through hole 41 in the reflecting sheet 4 abuts against the convex portion 32 of each lens 3. In this state, when the slit 43 part of the through hole 41 in the reflecting sheet 4 is presses toward the LED board 2, the slit 43 part in the convex portion 32 is warped in a direction departing from the convex portion 32 and hence the slit 43 part is fit into a space between the convex portion 32 and the LED board 2. Thus, the reflecting sheet 4 is restricted from deviating in a direction departing from the surface 2a.

The convex portion 32 of the lens 3 easily causes luminance inhomogeneity in comparison with the lens 3 without the convex portion 32. However, in the lens 3 in Embodiment 4, the convex portions 32 are in a staggered arrangement and hence the convex portions 32 are dispersed. Thus, the luminance inhomogeneity caused by the convex portion 32 is reduced further.

The other points in the configuration and the operation are similar to those in Embodiment 1. Thus, like components are designated by like numerals, and their detailed description and the description of operational effects are omitted.

Embodiment 5

FIG. 13 is a schematic plan view illustrating another configuration of the main part of a light source device. In this light source device, the lenses 3 are disposed such that the convex portion 32 of each lens 3 is oriented upward when the supporting body 6 is disposed in a vertical orientation.

When the supporting body 6 is disposed in a vertical orientation, the LED boards 2 having a strip shape are aligned such that their longer sides are in the horizontal direction. Further, the lenses 3 attached to the surface 2a of each LED board 2 are disposed such that the convex portions 32 are in the width direction of the LED board 2 and that the convex portions 32 are in the upward direction.

At the edge of the through hole 41 in the reflecting sheet 4, a slit 43 is provided in a part opposite to the center in the width direction of the convex portion 32 of each lens 3.

In the present embodiment, when the reflecting sheet 4 is placed opposite to the surface 2a of the LED board 2 and the lens 3 is disposed in each through hole 41 of the reflecting sheet 4, the slit 43 part at the edge of the through hole 41 in the reflecting sheet 4 abuts against the convex portion 32 of each lens 3. In this state, when the slit 43 part of the through hole 41 in the reflecting sheet 4 is presses toward the LED board 2, the slit 43 part in the convex portion 32 is warped in a direction departing from the convex portion 32 and hence the slit 43 part is fit into a space between the convex portion 32 and the LED board 2. Thus, the reflecting sheet 4 is restricted from deviating in a direction departing from the surface 2a.

When the supporting body 6 is disposed in a vertical orientation, the reflecting sheet 4 also is in a vertical orientation. Thus, the self-weight of the reflecting sheet 4 acts in the base side direction of the convex portion 32. Accordingly, the edge of the through hole 41 hardly departs from the convex portion 32, and hence an appropriate vertical orientation of the reflecting sheet 4 is maintained even by a short convex portion 32.

The other points in the configuration and the operation are similar to those in Embodiment 1. Thus, like components are designated by like numerals, and their detailed description and the description of operational effects are omitted.

Embodiment 6

Figure 15B:
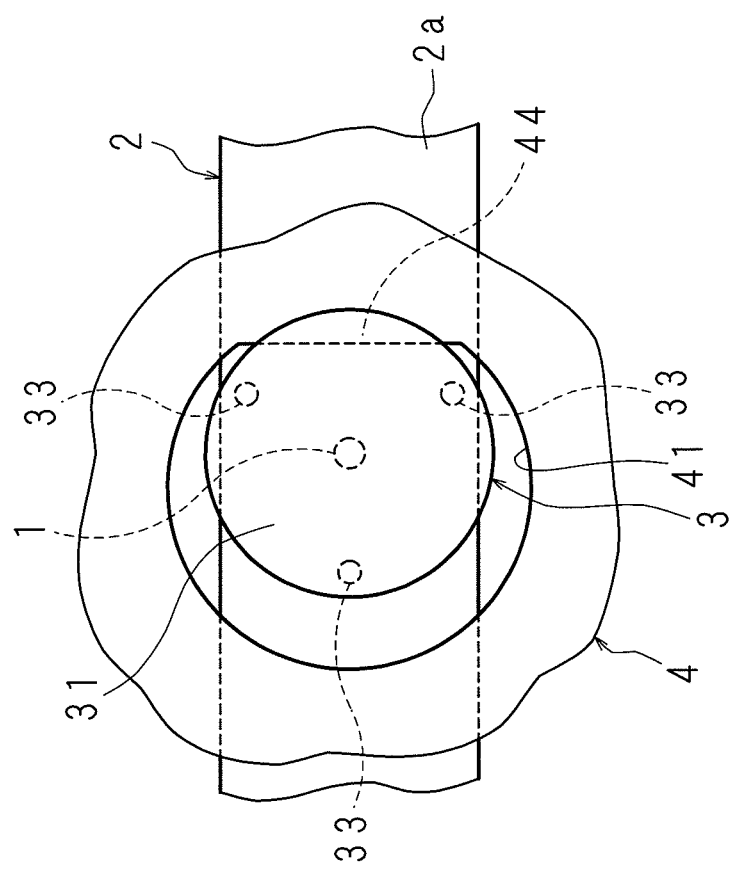
FIG. 15B is an explanation diagram illustrating a state that a reflecting sheet is under assembling.
Figure 16A:
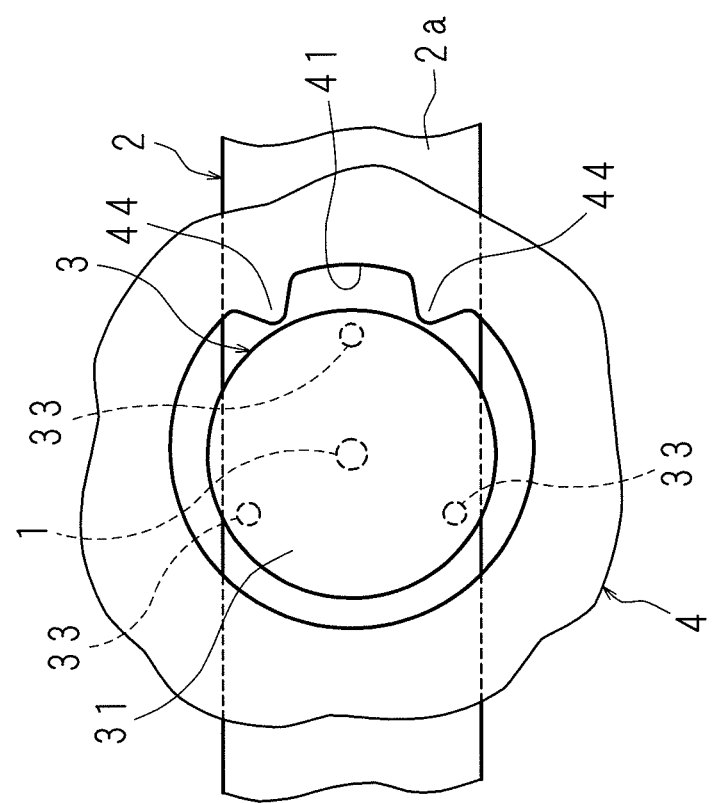
FIG. 16A is an enlarged plan view illustrating another configuration of a main part of a light source device according to the present invention.

FIGS. 14A, 15A, and 16A are enlarged plan views illustrating another configuration of the main part of a light source device. FIGS. 14B, 15B, and 16B are explanation diagrams illustrating a state that the reflecting sheet is under assembling. In this light source device, in place of a configuration that the convex portion 32 serving as restricting means is provided in the lens 3, a convex portion 44 serving as restricting means opposite to the attachment side surface 3a for attachment of the lens 3 to the LED board 2 is provided at the edge of the through hole 41 in the reflecting sheet 4 so that the convex portion 44 restricts the reflecting sheet 4 from deviating in a direction departing from the surface 2a.

In FIG. 14A, one convex portion 44 having an approximate V-shape is provided integrally at the edge of the through hole 41 formed in a round shape of a slightly larger diameter than the lens 3 without the convex portion 32.

In the present embodiment, when the reflecting sheet 4 is to be placed opposite to the surface 2a of the LED board 2, the lens 3 is fit into the through hole 41 and then the reflecting sheet 4 is moved in a direction along the LED board 2 in a state that the reflecting sheet 4 is placed on the surface 2a. Then, as illustrated in FIG. 14B, the convex portion 44 of the reflecting sheet 4 is fit into a space between the attachment side surface 3a of the lens 3 and the LED board 2. Thus, the reflecting sheet 4 is restricted from deviating in a direction departing from the surface 2a.

In FIG. 15A, the through hole 41 formed in a round shape of a slightly larger diameter than the lens 3 without the convex portion 32 has an approximate D-shape so that the non-round shape part of the through hole 41 serves as the convex portion 44.

In the present embodiment, when the reflecting sheet 4 is to be placed opposite to the surface 2a of the LED board 2, the lens 3 is fit into the through hole 41 and then the reflecting sheet 4 is moved in a direction along the LED board 2 in a state that the reflecting sheet 4 is placed on the surface 2a. Then, as illustrated in FIG. 15B, the convex portion 44 of the reflecting sheet 4 is fit into a space between the attachment side surface 3a of the lens 3 and the LED board 2. Thus, the reflecting sheet 4 is restricted from deviating in a direction departing from the surface 2a.

In FIG. 16A, at the edge of the through hole 41 formed in a round shape of a slightly larger diameter than the lens 3 without the convex portion 32, two convex portions 44 and 44 having an approximate V-shape are integrally provided separately from each other in a circumferential direction.

In the present embodiment, when the reflecting sheet 4 is to be placed opposite to the surface 2a of the LED board 2, the lens 3 is fit into the through hole 41 and then the reflecting sheet 4 is moved in a direction along the LED board 2 in a state that the reflecting sheet 4 is placed on the surface 2a. Then, as illustrated in FIG. 16B, the two convex portions 44 and 44 of the reflecting sheet 4 are fit into a space between the attachment side surface 3a of the lens 3 and the LED board 2. Thus, the reflecting sheet 4 is restricted from deviating in a direction departing from the surface 2a.

In the above-mentioned configuration that the convex portion 44 is provided at the edge of the through hole 41 in the reflecting sheet 4, the convex portion 44 also has a high reflectivity. This avoids the necessity of consideration of a luminance inhomogeneity caused by the convex portion 44, in comparison with a case that the convex portion 32 is provided in the lens 3.

The other points in the configuration and the operation are similar to those in Embodiment 1. Thus, like components are designated by like numerals, and their detailed description and the description of operational effects are omitted.

Embodiment 7

Figure 17B:
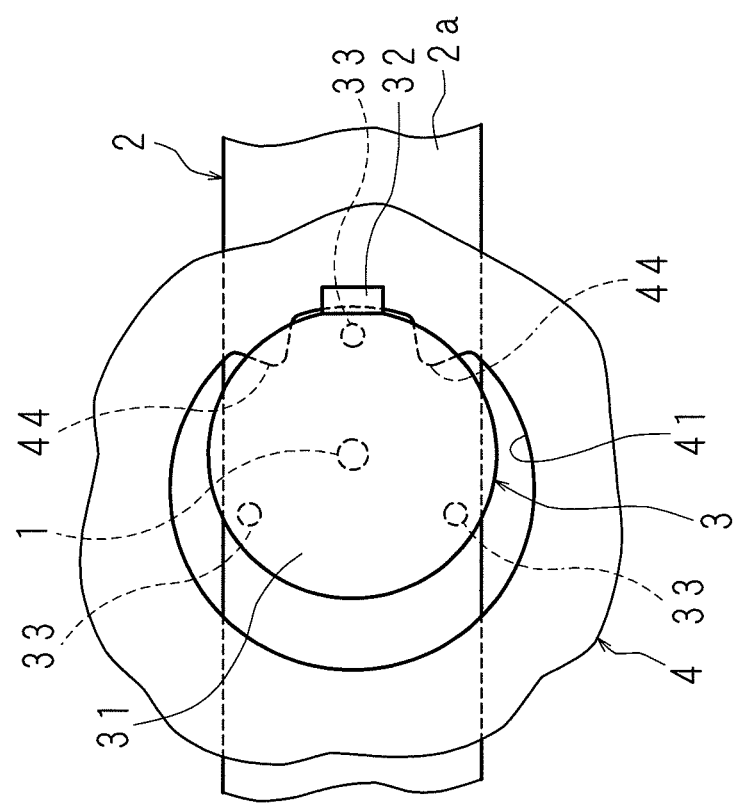
FIG. 17B is an explanation diagram illustrating a state that a reflecting sheet is under assembling.

FIG. 17A is an enlarged plan view illustrating another configuration of the main part of a light source device. FIG. 17B is an explanation diagram illustrating a state that the reflecting sheet is under assembling. In this light source device, in place of a configuration that the convex portions 32 and 44 serving as restricting means are provided in the lens 3 or the reflecting sheet 4, the convex portions 32 and 44 serving as restricting means are provided at the edge of the through hole 41 in the lens 3 and the reflecting sheet 4 so that the convex portions 32 and 44 restrict the reflecting sheet 4 from deviating in a direction departing from the surface 2a.

The convex portion 32 of the lens 3 and the convex portion 44 of the through hole 41 are provided separately in a circumferential direction on the side opposite to the peripheral surface of the lens 3 and the peripheral surface of the through hole 41. The through hole 41 is provided with two convex portions 44 and 44 disposed separately in a circumferential direction. The lens 3 is provided with one convex portion 32 disposed between the convex portions 44 and 44.

In the present embodiment, when the reflecting sheet 4 is to be placed opposite to the surface 2a of the LED board 2, the through hole 41 is fit into the lens 3 and then the reflecting sheet 4 is moved in a direction along the LED board 2 in a state that the reflecting sheet 4 is placed on the surface 2a. Then, as illustrated in FIG. 17B, the two convex portions 44 and 44 of the reflecting sheet 4 are fit into a space between the attachment side surface 3a of the lens 3 and the LED board 2. At the same time, the convex portion 32 of the lens 3 is opposite to the sheet surface of the reflecting sheet 4. Thus, both convex portions 32 and 44 restrict the reflecting sheet 4 from deviating in a direction departing from the surface 2a. Further, the convex portion 44 is opposite to the attachment side surface 3a of the lens 3 and the convex portion 32 is opposite to the sheet surface of the reflecting sheet 4. Thus, in comparison with a case that any one of the convex portions 32 and 44 is employed, the convex portions 32 and 44 are allowed to be formed shorter. This reduces the amount of the gap between the through hole 41 and the lens 3 peripheral surface. Thus, the amount of exposure of the LED board 2 exposed inside the through hole 41 is reduced.

The other points in the configuration and the operation are similar to those in Embodiment 1. Thus, like components are designated by like numerals, and their detailed description and the description of operational effects are omitted.

Here, Embodiments 2 to 7 described above may be combined with any one of Embodiments 1 to 7.

Further, in the embodiments described above, the width of the slit 43 provided at the edge of the through hole 41 in the reflecting sheet 4 is not limited to a particular value.

Further, in Embodiment 2 described above, the through hole 41 in the reflecting sheet 4 has been formed in a round hole shape having a larger diameter than the lens 3 with the convex portion 32. Instead, a non-circular hole shape corresponding to the transparent part 31 and the convex portion 32 may be employed. That is, the shape of the through hole 41 is not limited to a particular one.

Further, in Embodiments 6 to 7 described above, at the edge of the through hole 41, one convex portion 44 having an approximate V-shape has been provided integrally. Instead, without dedicatedly providing the convex portion 44, by virtue of the self-weight of the reflecting sheet 4, the reflecting sheet 4 may be assembled into the space between the attachment side surface 3a of the lens 3 and the LED board 2. That is, a construction may be employed that the edge of the through hole 41 locks to the positioning protrusion 33 when the self-weight acts on the reflecting sheet 4. For example, the lens 3 may be attached such that when the supporting body 6 is disposed in a vertical orientation, the positioning protrusion 33 is located on one longer-side side of the supporting body 6. At that time, the through hole 41 is formed in a slightly larger diameter than the transparent part 31. According to this configuration, when the supporting body 6 is disposed in a vertical orientation, the reflecting sheet 4 also is in a vertical orientation. Thus, by virtue of the self-weight of the reflecting sheet 4, the reflecting sheet 4 is assembled into a space between the attachment side surface 3a of the lens 3 and the LED board 2. This prevents the reflecting sheet 4 from rising from the LED board 2.

Further, in a case that by virtue of the self-weight of the reflecting sheet 4, the reflecting sheet 4 is assembled into the space between the attachment side surface 3a of the lens 3 and the LED board 2, a gap is generated between the through hole 41 and the lens 3 peripheral surface. Then, a difference in the reflection efficiency for the light from the LED 1 is caused depending on the amount of the gap and hence causes brightness inhomogeneity. Thus, it is preferable that the positioning protrusion 33 is disposed on one longer-side side of the supporting body 6. This configuration reduces the amount of the gap between the through hole 41 and the lens 3 peripheral surface and hence reduces brightness inhomogeneity. For example, the through hole 41 may be formed in an approximate D-shape, and then the reflecting sheet 4 may be disposed such that the gap corresponds to the non-arc edge of the through hole 41. This reduces brightness inhomogeneity and permits easy assembling of the reflecting sheet 4.

Further, in the embodiments described above, in addition to a configuration that a single convex portion 32 of the lens 3 and a single convex portion 44 of the reflecting sheet 4 are employed, a plurality of them may be disposed separately in a circumferential direction. That is, the number of convex portions 32 and 44 and the direction of convex portions 32 and 44 are not limited to particular ones.

Further, in the embodiments described above, the position of the positioning protrusion 33 has not been determined. In a case that the display device A is disposed in a vertical orientation, when a plurality of positioning protrusions 33 are disposed on one longer-side side of the supporting body 6, the amount of the gap between the through hole 41 and the lens 3 peripheral surface is reduced. Thus, the amount of exposure of the LED board 2 exposed inside the through hole 41 is reduced, and hence brightness inhomogeneity is suppressed. Further, when a plurality of positioning protrusions 33 are disposed along one longer side of the supporting body 6, the reflecting sheet 4 is disposed more stably and the rise of the reflecting sheet 4 is avoided.

Further, in the embodiments described above, the positioning protrusion 33 is formed in a cylindrical shape. Instead, a prism shape such as a quadrangular prism shape or a semicircular cylinder shape corresponding to the arc of the through hole 41 may be employed. When such a shape is employed, an increase is obtained in the contact area with the edge of the through hole 41 and hence in the frictional resistance with the positioning protrusion 33. This permits more stable assembling of the reflecting sheet 4.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A light source device comprising:
a circuit board having a LED mounted on a surface;
a lens attached to the surface so as to diffuse light emitted from the LED;
a reflecting sheet having a through hole in the inside of which the lens is disposed and reflecting light emitted from the LED at an opposite side of the surface, and
a restricting member which is disposed at one of an edge of the through hole in the reflecting sheet and the lens, and restricts a deviation of the reflecting sheet in a direction departing from the surface.

2. The light source device according to claim 1, wherein the restricting member is a convex portion disposed at the lens so as to oppose to a sheet surface of the reflecting sheet.

3. The light source device according to claim 1, wherein the restricting member is a convex portion disposed at an edge of the through hole so as to oppose to a side of the lens for attachment to the surface.

4. The light source device according to claim 2, wherein the reflecting sheet has flexibility and a slit is provided at an edge of the through hole in an opposite part of the convex portion.

5. The light source device according to claim 2, wherein the reflecting sheet is movable along the circuit board.

6. The light source device according to claim 1, wherein the lens includes a positioning protrusion oriented to the circuit board.

7. A display device comprising: a display part having a display surface on one side; and a light source device according to claim 1 disposed on the other side of the display unit.

8. A light source device comprising:
a circuit board having a LED mounted on a surface;
a lens attached to the surface so as to diffuse light emitted from the LED;
a reflecting sheet having a hole in the inside of which the lens is disposed and reflecting light emitted from the LED at an opposite side of the surface, and
a restricting member which is disposed at least at a part of an edge of the hole so as to oppose to a side of the lens for attachment to the surface, and restricts a deviation of the reflecting sheet in a direction departing from the surface.

9. The light source device according to claim 8, wherein the reflecting sheet is movable along the circuit board, and
the restricting member is placed at an opposite position to the side for attachment by moving of the reflecting sheet.

10. The light source device according to claim 8, comprising a supporting body which includes a plate part for supporting the circuit board, wherein
the plate part in the supporting body and the reflecting sheet is disposed in a vertical orientation,
the reflecting sheet is movable toward a lower position according to a self-weight of the reflecting sheet, and
the restricting member is placed at an opposite position to the side for attachment by moving of the reflecting sheet toward the lower position.

11. A display device comprising: a display part having a display surface on one side; and a light source device according to claim 8 disposed on the other side of the display unit.

* * * * *